US012009185B2

(12) United States Patent
Ma et al.

(10) Patent No.: US 12,009,185 B2
(45) Date of Patent: Jun. 11, 2024

(54) SEMICONDUCTOR PROCESSING APPARATUS HAVING IMPROVED TEMPERATURE CONTROL

(71) Applicant: Applied Materials, Inc., Santa Clara, CA (US)

(72) Inventors: Jun Ma, Milpitas, CA (US); Chen-An Chen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1013 days.

(21) Appl. No.: 16/269,376

(22) Filed: Feb. 6, 2019

(65) Prior Publication Data

US 2019/0252162 A1    Aug. 15, 2019

Related U.S. Application Data

(60) Provisional application No. 62/628,890, filed on Feb. 9, 2018.

(51) Int. Cl.
| | | |
|---|---|---|
| *H01L 21/67* | (2006.01) | |
| *C23C 16/458* | (2006.01) | |
| *H01J 37/32* | (2006.01) | |
| *H01L 21/687* | (2006.01) | |

(52) U.S. Cl.
CPC .... *H01J 37/32724* (2013.01); *C23C 16/4581* (2013.01); *C23C 16/4586* (2013.01); *H01L 21/67103* (2013.01); *H01L 21/67248* (2013.01); *H01L 21/67253* (2013.01); *H01L 21/68735* (2013.01); *H01L 21/68792* (2013.01); *H01J 2237/3321* (2013.01); *H01J 2237/3341* (2013.01)

(58) Field of Classification Search
None
See application file for complete search history.

(56) References Cited

U.S. PATENT DOCUMENTS 5,877,475 A * 3/1999 Hecht ............... H05B 3/74
219/448.11
6,081,414 A    6/2000 Flanigan et al.
(Continued)

FOREIGN PATENT DOCUMENTS

KR    10-2016-0004201 A    1/2016
KR    10-2017-0101973 A    9/2017
(Continued)

OTHER PUBLICATIONS

TW Search Report dated Mar. 18, 2021 for Application No. TW108104381.
(Continued)

*Primary Examiner* — Jeffrie R Lund
*Assistant Examiner* — Tiffany Z Nuckols
(74) *Attorney, Agent, or Firm* — Patterson & Sheridan LLP

(57) ABSTRACT

A pedestal for a semiconductor processing chamber is provided. The pedestal includes a first body comprising a ceramic material, wherein a plurality of heater elements are encapsulated within the first body, and a second body comprising a ceramic material, wherein one or more continuously curved grooves are formed in one or more surfaces of the second body. Additionally, the first body is coupled to the second body and encloses the grooves.

18 Claims, 4 Drawing Sheets

(56) References Cited

U.S. PATENT DOCUMENTS

| | | | |
|---|---|---|---|
| 6,914,222 B2* | 7/2005 | Nakamura | H01L 21/67103 219/544 |
| 7,573,003 B2* | 8/2009 | Gratz | H05B 3/746 219/448.11 |
| 9,263,305 B2 | 2/2016 | Ptasienski et al. | |
| 2004/0226514 A1* | 11/2004 | Mahon | H01J 37/32559 118/728 |
| 2009/0061542 A1* | 3/2009 | Patrick | C23C 16/50 324/71.2 |
| 2010/0163183 A1* | 7/2010 | Tanaka | H01L 21/67248 118/712 |
| 2011/0000568 A1 | 1/2011 | Parton | |
| 2011/0005686 A1 | 1/2011 | Tanaka et al. | |
| 2012/0211933 A1* | 8/2012 | Goto | H01L 21/68757 269/293 |
| 2015/0170977 A1* | 6/2015 | Singh | H01L 21/67109 118/712 |
| 2016/0002779 A1* | 1/2016 | Lin | H01L 21/67103 118/500 |
| 2016/0007411 A1* | 1/2016 | Busche | H05B 3/0047 392/408 |
| 2016/0007412 A1* | 1/2016 | Busche | H05B 3/14 392/408 |
| 2017/0263484 A1 | 9/2017 | Lin et al. | |
| 2017/0303338 A1 | 10/2017 | Parkhe | |
| 2018/0122659 A1* | 5/2018 | Tsuchida | H01L 21/67248 |
| 2020/0350187 A1* | 11/2020 | Takahashi | G01K 1/14 |

FOREIGN PATENT DOCUMENTS

| | | |
|---|---|---|
| TW | 201001592 A | 1/2010 |
| WO | 2013162000 A1 | 10/2013 |
| WO | 2016003630 A1 | 1/2016 |

OTHER PUBLICATIONS

KR Office Action dated Sep. 18, 2023 for Application No. KR 10-2020-7025798.

* cited by examiner

SEMICONDUCTOR PROCESSING APPARATUS HAVING IMPROVED TEMPERATURE CONTROL

CROSS-REFERENCE TO RELATED APPLICATIONS

This application claims benefit of U.S. provisional patent application Ser. No. 62/628,890, filed Feb. 9, 2018, which is hereby incorporated herein by reference.

BACKGROUND

Field

Embodiments disclosed herein generally relate to a semiconductor processing chamber and, more specifically, a heated support pedestal for a semiconductor processing chamber having multi-zone temperature control.

Description of the Related Art

Semiconductor processing involves a number of different chemical and physical processes enabling minute integrated circuits to be created on a substrate. Layers of materials which make up the integrated circuit are created by chemical vapor deposition, physical vapor deposition, epitaxial growth, and the like. Some of the layers of material are patterned using photoresist masks and wet or dry etching techniques. The substrate utilized to form integrated circuits may be silicon, gallium arsenide, indium phosphide, glass, or other appropriate material.

In the manufacture of integrated circuits, plasma processes are often used for deposition or etching of various material layers. Plasma processing offers many advantages over thermal processing. For example, plasma enhanced chemical vapor deposition (PECVD) allows deposition processes to be performed at lower temperatures and at higher deposition rates than achievable in analogous thermal processes. Thus, PECVD is advantageous for integrated circuit fabrication with stringent thermal budgets, such as for very large scale or ultra-large scale integrated circuit (VLSI or ULSI) device fabrication.

The processing chambers used in these processes typically include a substrate support or pedestal disposed therein to support the substrate during processing. In some processes, the pedestal may include an embedded heater adapted to adjust and control the temperature of the substrate and/or provide elevated temperatures that may be used in the process. Conventionally, the pedestals may be made of a ceramic material, which generally provide desirable device fabrication results.

However, ceramic pedestals create numerous challenges. One of these challenges is multiple zone heating and/or accurate temperature control of one or more of the zones. In addition, ceramic materials may not be readily machinable as compared to other materials, such as aluminum, and creates a manufacturing challenge for the forming of grooves therein for electrical leads and/or for embedded temperature sensing devices.

Therefore, what is needed is a pedestal that can be manufactured to provide accurate and consistent temperature control of the separately powered heating zones from one manufactured pedestal to another.

SUMMARY

Embodiments of the disclosure provided herein include a heated pedestal and method of forming the same. In one embodiment, a pedestal for a semiconductor processing chamber includes a first body comprising a ceramic material that includes a first surface, a plurality of heater elements are encapsulated within the first body, and a second body comprising a ceramic material with one or more continuously curved grooves are formed in one or more surfaces of the second body, and, the first body is coupled to the second body, and the first surface of the first body is positioned to enclose a region that is defined by the grooves formed in the one or more surfaces of the second body and a portion of the first surface.

In one embodiment, a pedestal for a semiconductor processing chamber, includes a first body comprising a ceramic material and a second body comprising a ceramic material, a plurality of heater elements encapsulated within the first body and one or more continuously curved grooves are formed in one or more surfaces of the first body or the second body, where the first body is coupled to the second body and encloses the grooves, and a temperature monitoring device disposed within the one or more continuously curved grooves.

In one embodiment, a pedestal for a semiconductor processing chamber, including a first body comprising a ceramic material that includes a first surface, a plurality of heater elements are encapsulated within the first body, and a second body comprising a ceramic material and a center hole positioned in the center of the second body, where one or more curved grooves are formed in one or more surfaces of the second body, and where the first body is coupled to the second body, and the first surface of the first body is positioned to enclose a region that is defined by the grooves formed in the one or more surfaces of the second body and a portion of the first surface.

BRIEF DESCRIPTION OF THE DRAWINGS

So that the manner in which the above-recited features of the present disclosure can be understood in detail, a more particular description, briefly summarized above, may be had by reference to embodiments, some of which are illustrated in the appended drawings. It is to be noted, however, that the appended drawings illustrate only typical embodiments and are therefore not to be considered limiting of its scope, for the embodiments disclosed herein may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure are illustratively described below in reference to plasma chambers, although embodiments described herein may be utilized in other chamber types and in multiple different substrate altering processes. In one embodiment, the plasma chamber is utilized in a plasma enhanced chemical vapor deposition (PECVD) system. Examples of PECVD systems that may be adapted to benefit from the disclosure include a PRODUCER® SE CVD system, a PRODUCER® GT™ CVD system or a DXZ® CVD system, all of which are commercially available from Applied Materials, Inc., Santa Clara, Calif. The Producer® SE CVD system chamber (e.g., 200 mm or 300 mm) has two isolated processing regions that may be used to deposit thin films on substrates, such as conductive films, oxide films such as silicon oxide films, carbon-doped silicon oxides and other materials. It is contemplated that embodiments disclosed herein may be utilized to an advantage in other plasma processing chambers, including etch chambers, ion implantation chambers, plasma treatment chambers, and in resist stripping chambers, among others. It is also contemplated that embodiments disclosed herein may be utilized to an advantage in other thermal processing chambers. It is further contemplated that embodiments disclosed herein may be utilized to advantage in thermal processing and/or plasma processing chambers available from other manufacturers.

Figure 1:
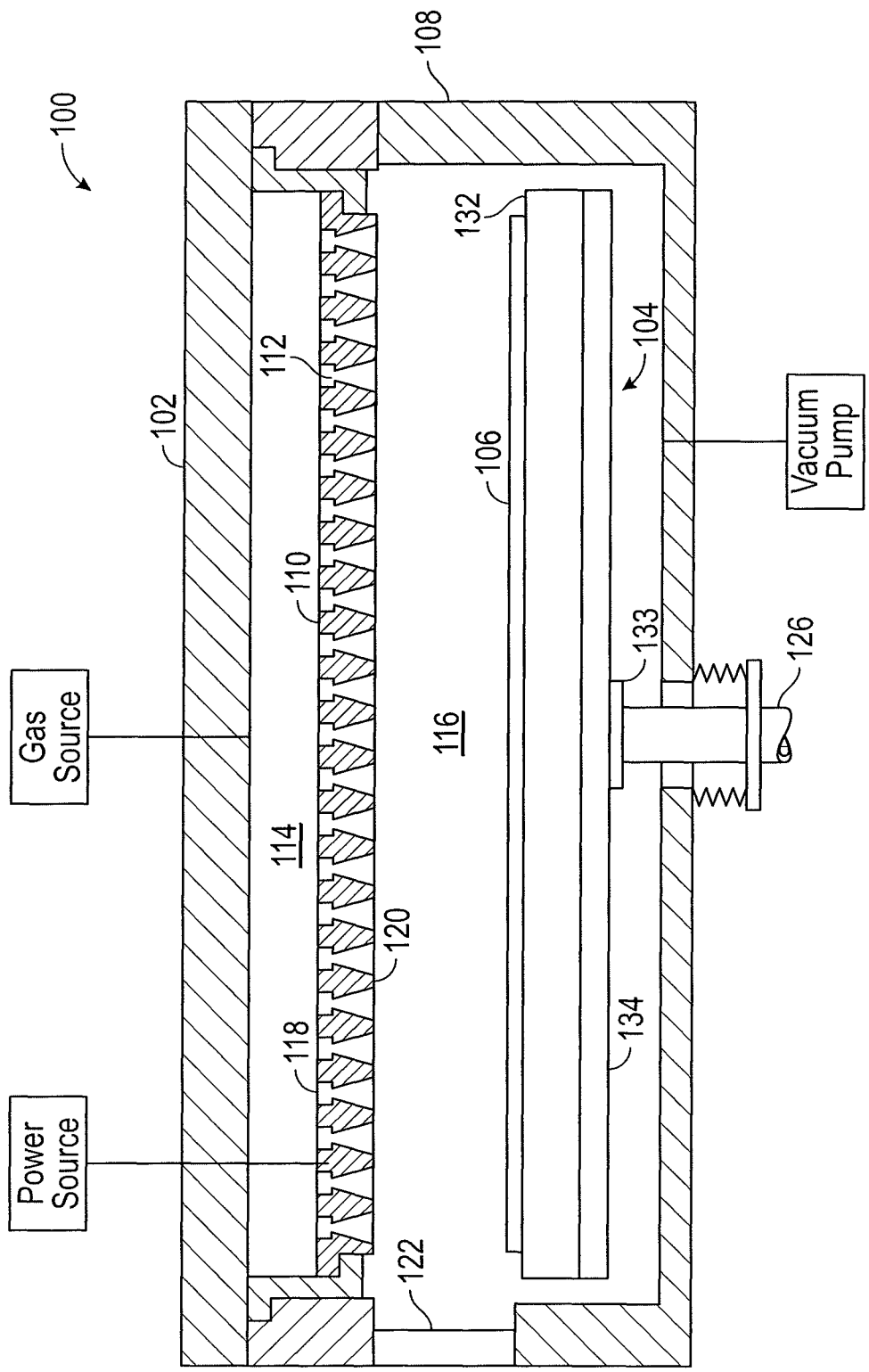
FIG. 1 is a partial cross sectional view of one embodiment of a plasma system.

FIG. 1 is a schematic cross sectional view of a processing chamber 100 according to one embodiment. The processing chamber 100 comprises a chamber body having a chamber lid assembly 102 and chamber walls 108. Within at least one chamber wall 108, one or more slit valve openings 122 may be present to permit insertion of substrates 106 into the processing space 116 and removal of substrates 106 from the processing space 116. The processing space 116 may be bound by the slit valve opening 122, chamber walls 108, substrate 106, and diffuser plate 110. In one embodiment, the diffuser plate 110 may be biased by a power source. The substrate 106 may be disposed on a support assembly, such as pedestal 104, having a first portion 132, a second portion 134 and a stem 126 coupled to the second portion by flange 133. The pedestal 104 may translate up and down to raise and lower the substrate 106 as necessary.

Gas may be introduced to an area between the diffuser plate 110 and the chamber lid assembly 102 called the plenum 114. The gas may be evenly distributed within the plenum 114 due to the gas flow restriction provided by the presence of gas passages 112 that extend from an upstream side 118 of the diffuser plate through to the downstream side 120.

Figure 2:
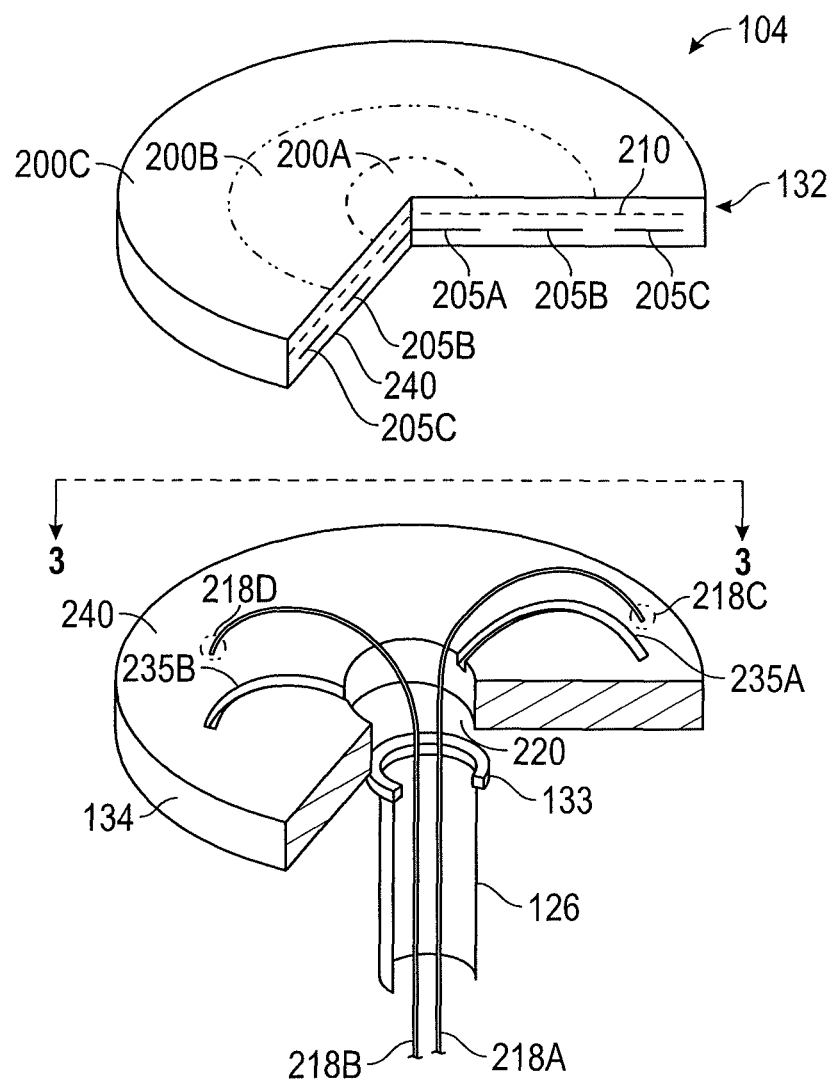
FIG. 2 is an isometric exploded cross-sectional view of one embodiment of a pedestal that may be used in the plasma system of FIG. 1.

FIG. 2 is an exploded cross-sectional view of one embodiment of a pedestal 104 that may be used in the processing chamber 100 of FIG. 1. As an example, the pedestal 104 comprises a three zone heater having a central zone 200A, an intermediate zone 200B and an outer zone 200C powered by respective heater elements 205A, 205B and 205C. The pedestal 128 includes a first portion 132, a second portion 134 and the stem 126 that is configured as a tubular member or hollow shaft. The stem 126 is coupled to the pedestal 104 by a flange 133. In one embodiment, the first portion 132 and the second portion 134 of pedestal 104, as well as the stem 126, are made of a ceramic material.

The heater elements 205A, 205B and 205C may be utilized to provide multiple, independently controlled heating zones on the pedestal 104. For example, the pedestal 104 may include a first heating zone configured as a central zone 200A, a second heating zone or intermediate zone 200B and a third heating zone shown as outer zone 200C. The first portion 132 may also include an electrode 210 therein for use in plasma generation in the adjacent processing region formed above the upper surface of the pedestal 104. The electrode 210 may be a conductive plate or a mesh material that is embedded in the first portion 132 that forms a body of the pedestal 104. Likewise, each of the central heater element 205A, intermediate heater element 205B and the outer heater element 205C may be formed from a wire or other electrical conductor embedded in the first portion 132 of the pedestal 104.

Electrical leads, such as wires, for the central heater element 205A, the intermediate heater element 205B and the outer heater element 205C, as well as the electrode 210, may be provided through the stem 126 and into center hole 220. Additionally, as shown in FIG. 2, temperature monitoring devices 218A and 218B, such as flexible thermocouples or RTDs, may be routed through the stem 126, center hole 220 of the second portion 134 and into grooves 235A and 235B formed in the second portion 134 to monitor the temperature of the various zones of the pedestal 104 during processing. In FIG. 2, temperature monitoring devices 218A and 218B are shown relative to grooves 235A and 235B respectively. In one embodiment, as shown in FIG. 2, grooves 235A and 235B are curved and are within the second portion 134 that forms the body of pedestal 104. Alternatively, in another embodiment not shown, grooves 235A and 235B are curved and positioned within the first portion 132 that forms the body of pedestal 104. Other grooves, which are not shown in the exploded cross-sectional view of FIG. 2, may be formed in either the first portion 132 or second portion 134 to contain electrical leads for connection to the central heater element 205A, intermediate heater element 205B and the outer heater element 205C, as well as to the electrode 210.

The temperature monitoring devices 218A and 218B are flexible thermocouples utilized to monitor temperature of the outer zone 200C and the intermediate zone 200B, respectively, of the three zone heater. The flexible nature of the flexible thermocouple allows the flexible thermocouple to conform to the curve of grooves 235A and 235B during installation. A separate central temperature monitoring device (not shown) may be provided through the stem 126 and center hole 220 to monitor the central zone 200A. The separate central temperature monitoring device may be a thermocouple or resistive thermometer (RTD).

As stated above, the pedestal 104 includes a ceramic material. The grooves 235A and 235B may be formed in the upper surface 240 of the second portion 134 prior to sintering of the ceramic material. The first portion 132 of the pedestal 104, also made of a ceramic material, may then be bonded to the upper surface 240 of the second portion 134 enclosing grooves 235A and 235B except for an end portion of the grooves 235A and 235B found at their intersection with the center hole 220. The first portion 132 and the second portion 134 may be bonded together by a low-temperature/low-pressure bonding process, such as a glass-phase bonding process. As sintering temperatures may cause the grooves 235A and 235B to deform or collapse, the low-temperature/low-pressure bonding process provides for maintenance of the dimensions of the grooves 235A and 235B. The stem 126, which is also made of a ceramic material, may also be bonded to the second portion 134 by the low-temperature/low-pressure bonding process. Once bonding is complete, the temperature monitoring devices 218A and 218B may be inserted into the inside diameter of the stem 126 and through center hole 220 of second portion 134, and then inserted into the curved grooves 235A and 235B of the pedestal 104.

Due to the non-linear shape of the curved grooves 235A and 235B and the natural resistance to bending provided by the temperature monitoring devices, the temperature sensing portions 218C and 218D (e.g., thermocouple ends) of each of the temperature monitoring devices 218A and 218B are pressed against the side wall of their respective curved groove. The temperature sensing portion of a temperature monitoring device will tend to be urged against and thus contact the side wall that is furthest from the origin of the radius of curvature of the curved groove. It is also believed that the force generated by the resistance to bending of the temperature monitoring devices, when the temperature monitoring devices are inserted into the grooves, will tend to improve the thermal contact of the sensing portion of the temperature monitoring devices to the first or second portions of the pedestal. The improved thermal contact of the temperature monitoring devices will improve the ability of the temperature control system in the processing chamber 100 to monitor and control the temperature in the pedestal 104 during substrate processing activities over conventional designs where the temperature sensing portion of a temperature monitoring device is uncontrolled when the temperature sensing portion is positioned within a region of a conventionally designed pedestal. The improved thermal contact of the temperature monitoring devices can also improve the reliability and/or repeatability of the temperature measurements provided from one manufactured pedestal to another due to the smaller variability in thermal contact resistance at the sensing portions of the temperature monitoring devices from one manufactured pedestal to another. Such improved repeatability may be due, at least in part, to the more repeatable position of the temperature sensing portions of each of the temperature monitoring devices within the respective grooves for each temperature monitoring device.

As noted above, the placement of the temperature monitoring devices 218A and 218B through center hole 220 and within the curved grooves 235A and 235B provides enhanced temperature measurement of the outer zone 200C and the intermediate zone 200B as compared to conventional heater designs. For example, in conventional heaters, temperature monitoring of outer zones of the heater is based on monitoring of the resistance of the heating elements embedded in the heater. Temperature monitoring at low temperatures (e.g., below about 300 degrees C., utilized in some film deposition processes) is difficult using the conventional resistance coefficients of the heating elements. However, utilization of the grooves 235A and 235B and corresponding temperature monitoring devices 218A and 218B, provides more precise and repeatable temperature measurements than can be provided using resistance coefficients of the heating elements. This enhanced temperature monitoring provides more accurate temperature metrics in the outer zone 200C and the intermediate zone 200B, especially at low temperatures and/or when the pedestal temperature is changing rapidly. Thus, the temperature monitoring provided by the temperature monitoring devices 218A and 218B may also facilitate faster temperature measurement response times at high or low temperatures such that a desired temperature profile across the pedestal 104 may be realized. The desired temperature profile across the pedestal 104 provides a desired temperature profile on a substrate which increases uniformity in films deposited on the substrate.

Figure 3:
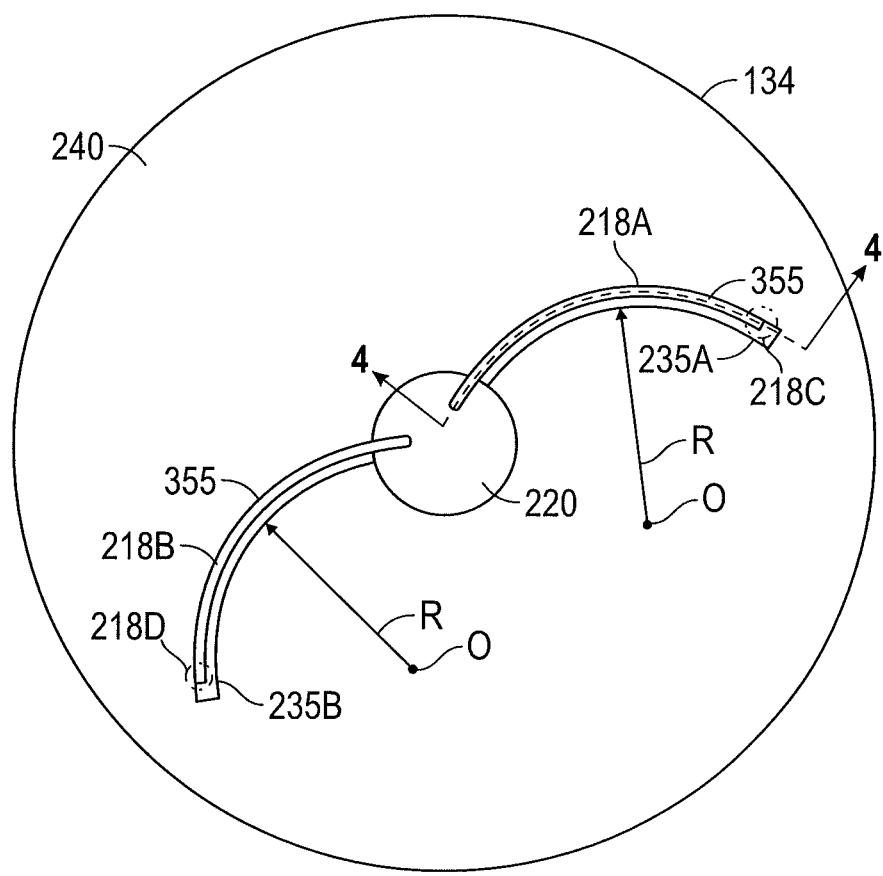
FIG. 3 is a top view of the pedestal taken along section line 3-3 in FIG. 2.

FIG. 3 shows a plan view of pedestal 104 taken along section line 3-3 in FIG. 2. For clarity, FIG. 3 shows a plan view of second portion 134 of pedestal 104, including the section portion not shown in FIG. 2. Grooves 235A and 235B are shown in the upper surface 240 of the second portion 134 and have a continuous curve or arc. Grooves 235A and 235B are shown in the shape of an arc having a continuous curvature based on a radius R that is measure from the radius origin O. The curvature of grooves 235A and 235B provide enhanced contact of the temperature monitoring devices 218A and 218B as the temperature monitoring devices 218A and 218B press against the sidewalls 355 of curved grooves 235A and 235B. The temperature monitoring devices 218A and 218B are shown positioned from center hole 220 of second portion 134 and into grooves 235A and 235B. Grooves 235A and 235B each form a continuous curve that follows at least one radius R beginning from center hole 220. The at least one radius R of the grooves 235A and 235B may be between about 0.5 inches and about 50 inches, such as about 1.0 inches and 10 inches, such as about 3.0 inches and 5.0 inches. In some embodiments, the continuous curve of the grooves 235A and 235B have a varying curvature that can be configured to better control the thermal contact of the temperature sensing portions of the temperature monitoring devices 218A and 218B within certain portion of the pedestal. In one example, the radius of curvature of the groove decreases as the groove extends away from the center hole 220 so that the thermal contact of the temperature sensing portion of the temperature monitoring device will increase as the temperature sensing portion is inserted into the groove from the center hole 220 (e.g., contact force increases). The position of the curved grooves 235A and 235B, within the second portion 134 of pedestal 104, may be positioned as needed to avoid other features of the pedestal 104 such as lift pin holes, electrical terminals and lines serving the heater elements 205A-205O and electrode 210. Advantages of contact between a sidewall 355 of grooves 235A and 235B and the temperature sensing portions 218C and 218D of the temperature monitoring device 218A or 218B include faster response time and repeatable temperature readings, because the temperature monitoring devices 218A and 218B are not spaced from the surface of the groove by an air gap or vacuum gap that can contribute to inaccurate or unreliable readings. In addition, the force created by the temperature sensing portions of the temperature monitoring device against wall of the curved groove helps maintain the position of the temperature monitor device within the groove during manufacturing and/or installation of the pedestal within the substrate processing system. This configuration may be particularly useful in low temperature applications (i.e., below 300 degrees Celsius) and may also be beneficial in a temperature control loop.

Figure 4:
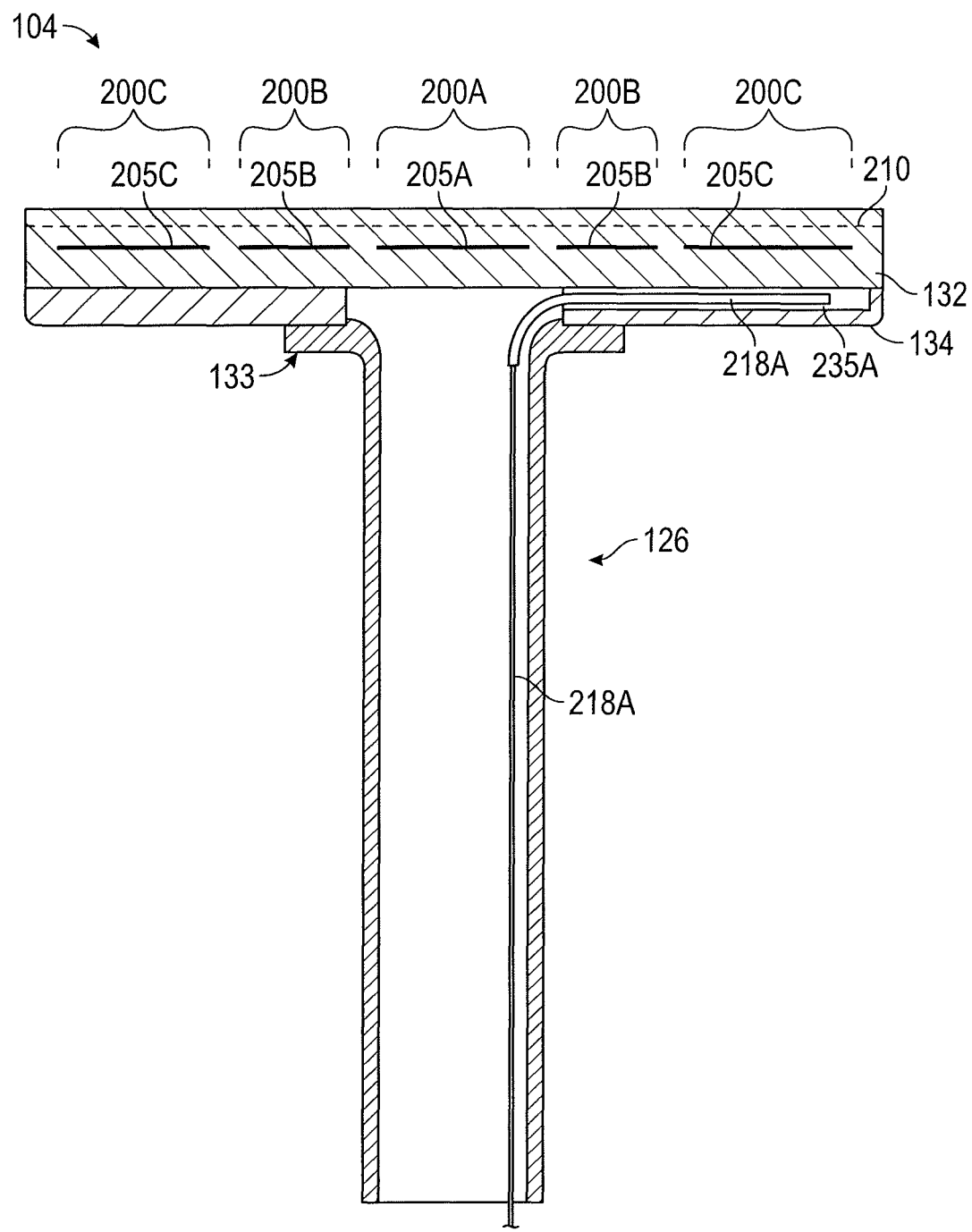
FIG. 4 is a cross-sectional view of the pedestal taken along section line 4-4 in FIG. 3.

FIG. 4 shows a cross-sectional view of pedestal 104 taken along the curved section line 4-4 in FIG. 3. A cross section of the pedestal 104, including first portion 132, second portion 134 and stem 126, is provided for clarity and reference to related embodiments. Temperature monitoring device 218A, such as a flexible thermocouple, is positioned within the continuously curved groove 235A of second portion 134, the curved groove ensuring contact between the temperature monitoring device 218A and the wall of groove 235A. The locations of the temperature monitoring device 218A within curved groove 235A may be chosen based on a desired measurement location within the pedestal 104 and associated with one of the heated zones 200B or 200C. The measurement location may be chosen based on desired response time, avoidance of heating element interference, or other reasons. In some embodiments, the end of the temperature monitoring device 218A may be at or near the center in one or more heated zones 200B or 200C and below heater elements 205B or 205C within first portion 132. In other embodiments, the ends of the temperature monitoring device 218A may be off-center in one or more zones. Precise positioning of a temperature monitoring device within the grooves is easy to accomplish when a specific length of the temperature monitoring device and a length of the groove is known. For example, when the length of a groove within the pedestal is known, and the position of the heating element within the pedestal is known, a temperature monitoring device 218A of a desired length can be inserted into the stem 126 such that an end thereof is positioned at a desired location in the groove 235A relative to the heating element. In some embodiments, it is desirable to position the temperature monitoring device such that the temperature sensing portion is not positioned at or abut the end of a groove (e.g., region of the groove furthest from the center hole 220). Embodiments of the pedestals as described herein also eases replacement of the temperature monitoring devices 218A such that temperature monitoring devices 218A of varying lengths may be used, if desired, to change the measurement location.

Embodiments of a pedestal described herein provide a multi-zone heater that provides better contact for the temperature monitor device providing more accurate readings as well as a wider range of temperature measurement. Low temperature measurement is also enhanced, which increases the applicability of the heater to low temperature film formation processes.

While the foregoing is directed to embodiments of the disclosure, other and further embodiments of the disclosure may be devised without departing from the basic scope thereof, and the scope thereof is determined by the claims that follow.

What is claimed is:

1. A pedestal for a semiconductor processing chamber, comprising:
   a first body comprising a ceramic material that includes a first surface, wherein a plurality of heater elements are encapsulated within the first body;
   a second body comprising a ceramic material, the second body having one or more continuously curved grooves formed in one or more surfaces of the second body, the one or more continuously curved grooves having a bottom wall and a continuously curved sidewall; and
   a flexible temperature monitoring device disposed within the one or more continuously curved grooves, the flexible temperature monitoring device having a temperature sensing portion disposed at an end of the flexible temperature monitoring device, wherein:
   the first body is coupled to the second body,
   the first surface of the first body is positioned to enclose a region that is defined by the one or more continuously curved grooves formed in the one or more surfaces of the second body and a portion of the first surface, the portion of the first surface forming a top wall of the one or more continuously curved grooves, and
   the flexible temperature monitoring device and the temperature sensing portion are continuously positioned against the continuously curved sidewall of one or more of the one or more continuously curved grooves providing a gap between the flexible temperature monitoring device and along a sidewall opposite the continuously curved sidewall of the one or more of the one or more continuously curved grooves.

2. The pedestal of claim 1, wherein the temperature monitoring device is a flexible thermocouple.

3. The pedestal of claim 1, wherein one or more of the one or more continuously curved grooves has a constant radius.

4. The pedestal of claim 1, wherein one or more of the one more continuously curved grooves has a radius of between about 0.5 inches and 50.0 inches.

5. The pedestal of claim 1, wherein one or more of the one or more continuously curved grooves has a radius of between about 3.0 inches and 5.0 inches.

6. The pedestal of claim 1, wherein the one or more of the continuously curved grooves is on a horizontal plane.

7. A pedestal for a semiconductor processing chamber, comprising:
   a first body comprising a ceramic material and a second body comprising a ceramic material;
   a plurality of heater elements encapsulated within the first body;
   one or more continuously curved grooves formed in one or more surfaces of the first body or the second body, wherein the first body is coupled to the second body and encloses the one or more continuously curved grooves, the one or more continuously curved grooves having a top wall, a bottom wall and continuously curved sidewalls; and
   a flexible temperature monitoring device having a temperature sensing portion, the flexible temperature monitoring device and the temperature sensing portion disposed within the one or more continuously curved grooves and continuously positioned against a continuously curved sidewall of one or more of the one or more continuously curved grooves along the length of the flexible temperature monitoring device and the temperature sensing portion providing a gap between the flexible temperature monitoring device and along a sidewall opposite the continuously curved sidewall of the one or more of the one or more continuously curved grooves.

8. The pedestal of claim 7, wherein the temperature monitoring device is a flexible thermocouple.

9. The pedestal of claim 7, wherein one or more of the one or more continuously curved grooves has a constant radius.

10. The pedestal of claim 7, wherein one or more of the one or more continuously curved grooves has a radius of between about 0.5 inches and 50.0 inches.

11. The pedestal of claim 7, wherein one or more of the one or more continuously curved grooves has a radius of between about 3.0 inches and 5.0 inches.

12. The pedestal of claim 7, wherein the one or more of the continuously curved grooves is on a horizontal plane.

13. A pedestal for a semiconductor processing chamber, comprising:
   a first body comprising a ceramic material that includes a first surface, wherein a plurality of heater elements are encapsulated within the first body;
   a second body comprising a ceramic material and a center hole positioned in the center of the second body, wherein one or more curved grooves having a bottom wall and a curved sidewall are formed in one or more surfaces of the second body; and
   a temperature monitoring device disposed within the one or more curved grooves, the temperature monitoring device having a temperature sensing portion, wherein:
   the first body is coupled to the second body,
   the first surface of the first body is positioned to enclose a region that is defined by the one or more curved grooves formed in the one or more surfaces of the second body and a portion of the first surface, the portion of the first surface forming a top wall of the one or more curved grooves, and
   the temperature monitoring device and the temperature sensing portion are continuously positioned against the curved sidewall of one or more of the one or more curved grooves along the length of the flexible temperature monitoring device and the temperature sensing portion providing a gap between the flexible temperature monitoring device and along a sidewall opposite the continuously curved sidewall of the one or more of the one or more continuously curved grooves.

14. The pedestal of claim 13, wherein one or more of the one or more curved grooves is a continuously curved grooved.

15. The pedestal of claim 14, wherein the continuously curved groove has a constant radius.

16. The pedestal of claim 13, wherein the temperature monitoring device is a flexible thermocouple.

17. The pedestal of claim 13, wherein one of more of the one or more curved grooves has a constant radius.

18. The pedestal of claim 13, wherein the one or more of the continuously curved grooves is on a horizontal plane.

* * * * *